(12) United States Patent
Teysseyre et al.

(10) Patent No.: US 11,848,320 B2
(45) Date of Patent: Dec. 19, 2023

(54) POWER MODULE PACKAGE FOR DIRECT COOLING MULTIPLE POWER MODULES

(71) Applicant: SEMICONDUCTOR COMPONENTS INDUSTRIES, LLC, Phoenix, AZ (US)

(72) Inventors: Jerome Teysseyre, Scottsdale, AZ (US); Inpil Yoo, Unterhaching (DE); JooYang Eom, Gimpo-si (KR)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

(21) Appl. No.: 17/822,844

(22) Filed: Aug. 29, 2022

(65) Prior Publication Data

US 2022/0406767 A1 Dec. 22, 2022

Related U.S. Application Data

(62) Division of application No. 16/949,896, filed on Nov. 19, 2020, now Pat. No. 11,430,777.

(51) Int. Cl.
| | |
|---|---|
| H01L 25/00 | (2006.01) |
| H01L 25/18 | (2023.01) |
| H01L 23/367 | (2006.01) |
| H01L 23/467 | (2006.01) |
| H01L 23/473 | (2006.01) |
| H01L 25/07 | (2006.01) |

(52) U.S. Cl.
CPC .......... *H01L 25/50* (2013.01); *H01L 23/3677* (2013.01); *H01L 23/467* (2013.01); *H01L 23/473* (2013.01); *H01L 25/072* (2013.01); *H01L 25/18* (2013.01)

(58) Field of Classification Search
CPC .......... H01L 25/50; H01L 23/3677
See application file for complete search history.

(56) References Cited

U.S. PATENT DOCUMENTS

| | | |
|---|---|---|
| 6,143,977 A | 11/2000 | Kitahara et al. |
| 6,397,450 B1 | 6/2002 | Ozmat |
| 8,358,000 B2 | 1/2013 | Beaupre et al. |
| 9,721,870 B2 | 8/2017 | Bodenweber et al. |
| 10,256,119 B2 | 4/2019 | Basler et al. |

(Continued)

OTHER PUBLICATIONS

U.S. Appl. No. 16/949,896, filed Nov. 19, 2020.

*Primary Examiner* — Thao P Le
(74) *Attorney, Agent, or Firm* — Brake Hughes Bellermann LLP

(57) ABSTRACT

According to an aspect, a power module package includes a plurality of power modules including a first power module and a second power module, a plurality of heat sinks including a first heat sink coupled to the first power module and a second heat sink coupled to the second power module, and a module carrier coupled to the plurality of power modules, where the module carrier includes a first region defining a first heat-sink slot and a second region defining a second heat-sink slot. The first heat sink extends at least partially through the first heat-sink slot and the second heat sink extends at least partially through the second heat-sink slot. The power module package includes a housing coupled to the module carrier and a ring member located between the module carrier and the housing.

20 Claims, 15 Drawing Sheets

(56) References Cited

U.S. PATENT DOCUMENTS

| | | | |
|---|---|---|---|
| 10,903,409 B1* | 1/2021 | Kelley | B60L 50/51 |
| 2001/0052639 A1 | 12/2001 | Jeon et al. | |
| 2011/0233757 A1 | 9/2011 | O'Neill | |
| 2011/0255850 A1 | 10/2011 | Dinh et al. | |
| 2013/0214406 A1* | 8/2013 | Schultz | H01L 23/46 |
| | | | 257/713 |
| 2014/0110565 A1 | 4/2014 | Teysseyre et al. | |
| 2016/0187483 A1 | 6/2016 | Luan et al. | |
| 2018/0352666 A1 | 12/2018 | Liskow | |
| 2019/0019693 A1 | 1/2019 | Or-Bach et al. | |
| 2019/0341332 A1 | 11/2019 | Lin et al. | |
| 2019/0385929 A1 | 12/2019 | Ku et al. | |
| 2020/0006194 A1 | 1/2020 | Huang et al. | |
| 2020/0258824 A1 | 8/2020 | Maldo et al. | |
| 2021/0035738 A1 | 2/2021 | Goh et al. | |
| 2021/0111104 A1 | 4/2021 | Yoo et al. | |
| 2021/0242167 A1 | 8/2021 | Yoo et al. | |
| 2021/0305063 A1 | 9/2021 | Or-Bach et al. | |
| 2022/0336317 A1* | 10/2022 | Yeh | H01L 23/13 |
| 2023/0154828 A1* | 5/2023 | Haba | H01L 23/473 |
| | | | 257/714 |
| 2023/0238297 A1* | 7/2023 | Choi | H01L 23/46 |
| | | | 257/668 |

* cited by examiner

POWER MODULE PACKAGE FOR DIRECT COOLING MULTIPLE POWER MODULES

RELATED APPLICATIONS

This application is a divisional application of U.S. patent application Ser. No. 16/949,896, filed Nov. 19, 2020, which is incorporated by reference herein in its entirety.

TECHNICAL FIELD

This description relates to a power module package for direct cooling multiple power modules.

BACKGROUND

A power module package may contain multiple power modules. However, some conventional power module packages may be relatively large to meet cooling performance requirements.

SUMMARY

According to an aspect, a power module package for direct cooling multiple power modules includes a plurality of power modules including a first power module and a second power module, a plurality of heat sinks including a first heat sink coupled to the first power module and a second heat sink coupled to the second power module, and a module carrier coupled to the plurality of power modules, where the module carrier includes a first region defining a first heat-sink slot and a second region defining a second heat-sink slot. The first heat sink extends at least partially through the first heat-sink slot and the second heat sink extends at least partially through the second heat-sink slot. The power module package includes a housing coupled to the module carrier, where the module carrier is disposed between the housing and the plurality of power modules. The power module package includes a ring member located between the module carrier and the housing.

According to some aspects, the power module package may include one or more of the following features (or any combination thereof). The first heat sink includes metal pin fins. The first region may include at least one positioning guide configured to align at least one of the first power module or the first heat sink. The module carrier includes a plastic material. The plurality of power modules may include a third power module and the plurality of heat sinks may include a third heat sink coupled to the third power module. The module carrier includes a third region defining a third heat-sink slot, and the third heat sink extends at least partially through the third heat-sink slot. Each of the first power module, the second power module, and the third power module may correspond to a separate phase of a three phase current of an inverter. The ring member includes an O-ring that extends around the first power module, the second power module, and the third power module, collectively. The first power module includes a half-bridge module. The module carrier is coupled to the housing via one or more fasteners.

According to an aspect, a power module package for direct cooling multiple power modules includes a plurality of power modules including a first power module, a second power module, and a third power module, a plurality of heat sinks including a first heat sink coupled to the first power module, a second heat sink coupled to the second power module, and a third heat sink coupled to the third power module, and a module carrier coupled to the plurality of power modules, the module carrier including a first region defining a first heat-sink slot, a second region defining a second heat-sink slot, and a third region defining a third heat-sink slot. The first heat sink extends at least partially through the first heat-sink slot. The second heat sink extends at least partially through the second heat-sink slot. The third heat sink extends at least partially through the third heat-sink slot. The power package module includes a housing coupled to the module carrier, where the housing is coupled to the module carrier being located between the housing and the plurality of power modules.

According to some aspects, the power module package may include one or more of the following features (or any combination thereof). The power module package may include a ring member located between the module carrier and a surface of the housing. The first region defines one or more module positioning guides. The first region defines one or more heat-sink positioning guides. Each of the first power module, the second power module, and the third power module corresponds to a separate phase of a three phase current of an inverter. Each of the first heat sink, the second heat sink, and the third heat sink include metal pin fins. The module carrier includes a metal-based material.

According to an aspect, a method of assembly a power module package integrating multiple power modules includes receiving a module carrier, the module carrier including a first region defining a first heat-sink slot and a second region defining a second heat-sink slot, applying an adhesive material to the first region and the second region, inserting a first heat sink coupled to a first power module through the first heat-sink slot until the first power module contacts the adhesive material, and inserting a second heat sink coupled to a second power module through the second heat-sink slot until the second power module contacts the adhesive material. In some examples, each of the first region and the second region defines one or more heat-sink positioning guides.

According to an aspect, a method of assembly a power module package integrating multiple power modules includes receiving a module carrier, the module carrier including a first region defining a first heat-sink slot and a second region defining a second heat-sink slot, inserting a first heat sink into the first heat-sink slot, inserting a second heat sink into the second heat-sink slot, applying an adhesive to the first region, the second region, the first heat sink, and the second heat sink, contacting a first power module to the adhesive on the first region and the first heat sink, and contacting a second power module to the adhesive on the second region and the second heat sink. Each of the first region and the second region defines one or more module positioning guides and one or more heat-sink positioning guides.

The details of one or more implementations are set forth in the accompanying drawings and the description below. Other features will be apparent from the description and drawings, and from the claims.

DETAILED DESCRIPTION

Figure 1A:
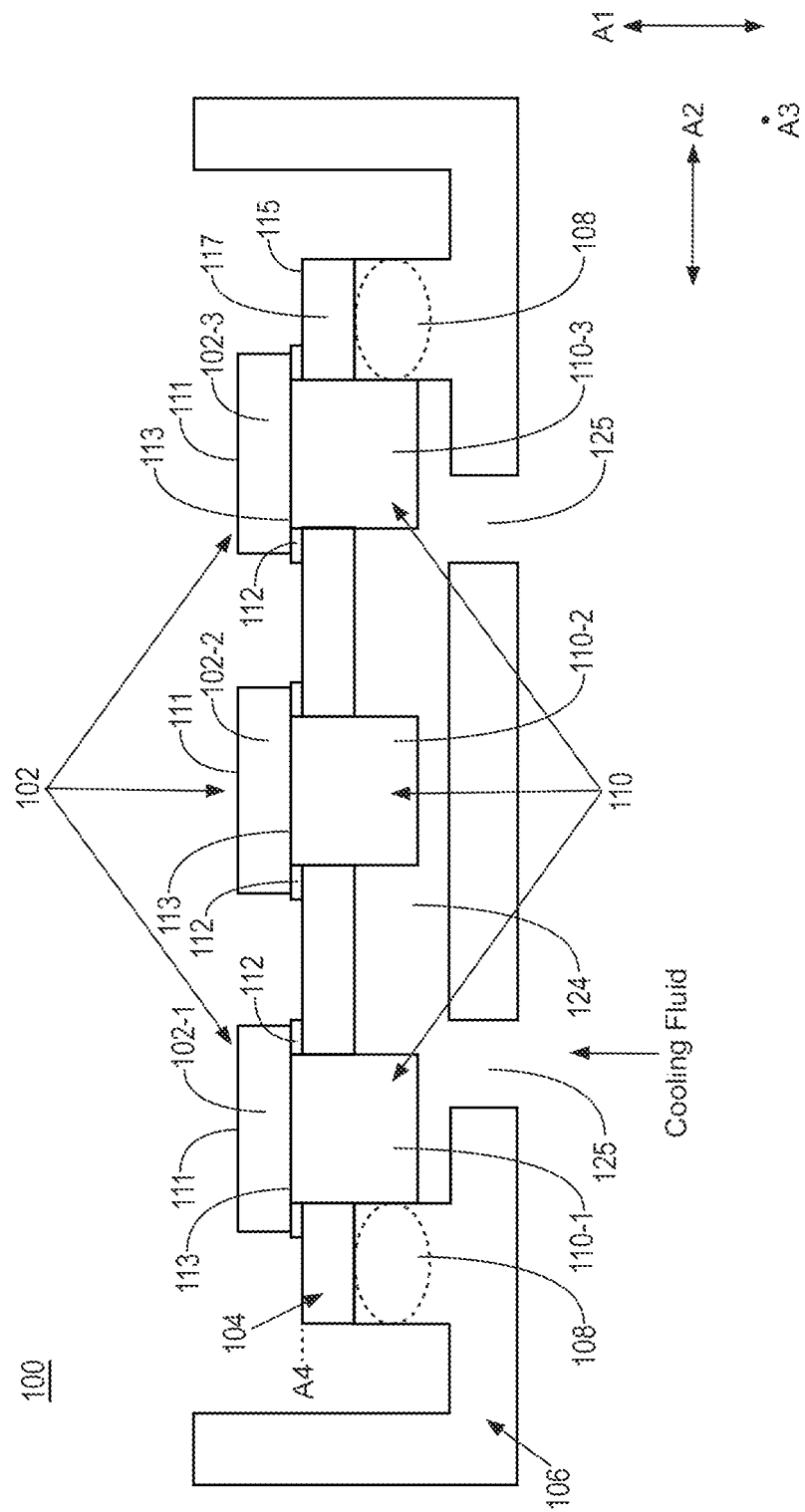
FIG. 1A illustrates a cross sectional view of a power module package according to an aspect.

The present disclosure relates to a power module package for direct cooling multiple power modules. The power module packages discussed herein may be compact, robust, and/or relatively easy to assemble while providing an efficient structure to permit direct cooling. The power module package includes a plurality of power modules, a plurality of heat sinks coupled to the power modules, a module carrier coupled to the power modules, a housing coupled to the module carrier, and a ring member located (e.g., disposed) between the module carrier and the housing.

In some examples, the power modules include two power modules. In some examples, the power modules include three power modules. In some examples, the power modules include half-bridge power modules. The power module package may include a first power module, a second power module, and a third power module, where each module corresponds to a separate phase of a three-phase current (UVM) of an inverter. In some examples, the power modules include more than three power modules.

The power modules are integrated into the module carrier, and the module carrier is coupled to the housing such that the module carrier is disposed between the power modules and the module carrier. In some examples, the housing is a housing for an inverter. The ring member may be disposed within a groove on the housing, and may extend around the power modules, collectively. In some examples, the power module package includes a single ring member. The module carrier may define a number of regions, where each region defines a heat-sink slot. For example, the module carrier may include a first region defining a first heat-sink slot and a second region defining a second heat-sink slot. In some examples, each of the first region and the second region includes one or more positioning guides that properly align a power module and/or a heat sink on a respective region.

The power package module may be assembled according to a first assembly process. According to the first assembly process, in a pre-processing step, the heat sinks are coupled to the power modules. For example, the first power module is coupled to a first heat sink, and the second power module is coupled to a second heat sink. In some examples, the heat sinks include pin fin heat sinks, where a pin fin heat sink includes a base plate with a plurality of pin fins that extend from the base plate. The base plate is coupled to a surface of a power module. According to the first assembly process, an adhesive material is dispensed on each region such as the first region and the second region. The first heat sink is inserted into the first heat-sink slot until the first power module contacts the adhesive material on the first region (where the positioning guide(s) are used to properly align the first power module on the first region), and the second heat sink is inserted into the second heat-sink slot until the second power module contacts the adhesive material on the second region (where the positioning guide(s) are used to properly align the second power module on the second region). Then, the module carrier with the power modules are cured (e.g., oven cured by heat).

The power package module may be assembled according to a second assembly process. According to the second assembly process, the heat sinks are initially not coupled to the power modules, but rather the individual heat sinks are inserted into the heat-sink slots, and the power modules are then coupled to the module carrier and the heat sinks. For example, The first heat sink is inserted into the first heat-sink slot (where the positioning guide(s) are used to properly align the first heat sink on the first region), and the second heat sink is inserted into the second heat-sink slot (where the positioning guide(s) are used to properly align the second heat sink on the second region. Then, an adhesive material is dispensed on the first region, the second region, the first heat sink, and the second heat sink. The first power module is positioned on the adhesive material on the first region and the first heat sink, and the second power module is positioned on the adhesive material on the second region and the second heat sink. Then, the module carrier with the power modules are cured (e.g., oven cured by heat).

Figure 1B:
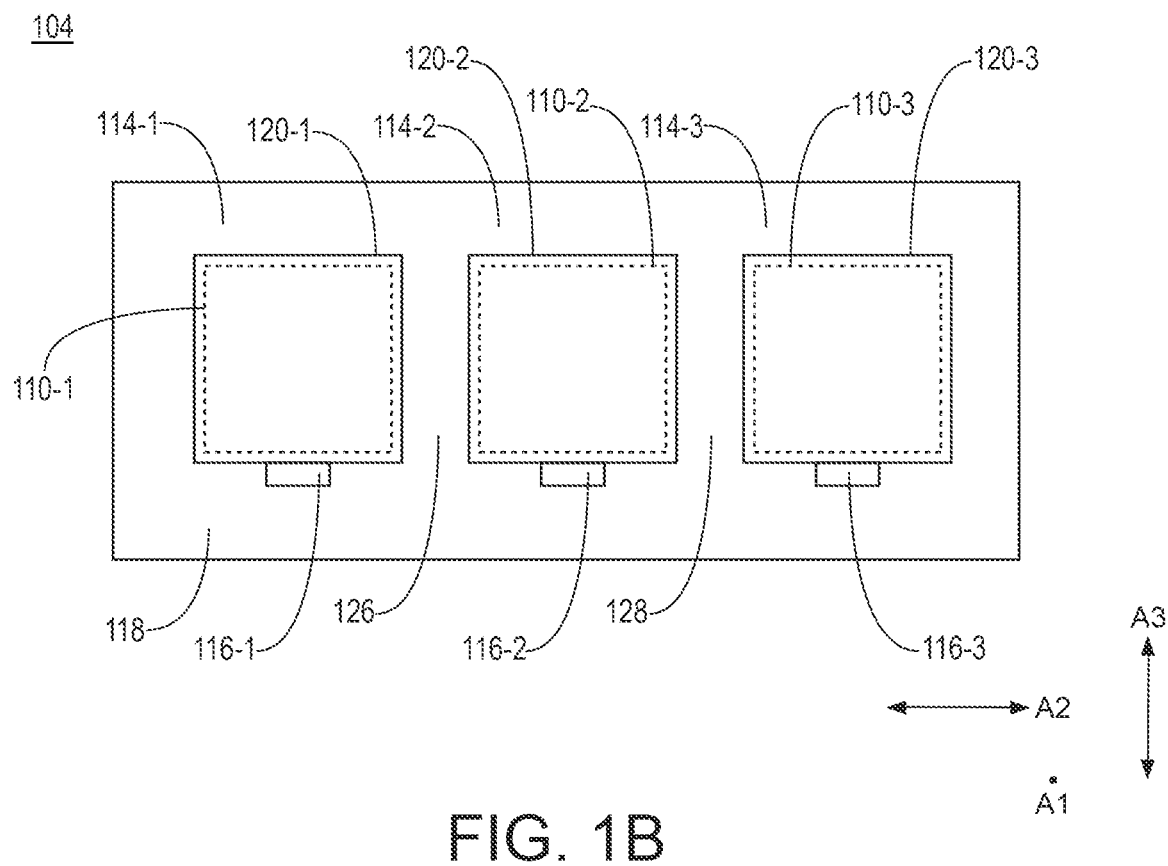
FIG. 1B illustrates a module carrier of the power module package according to an aspect.
Figure 1C:
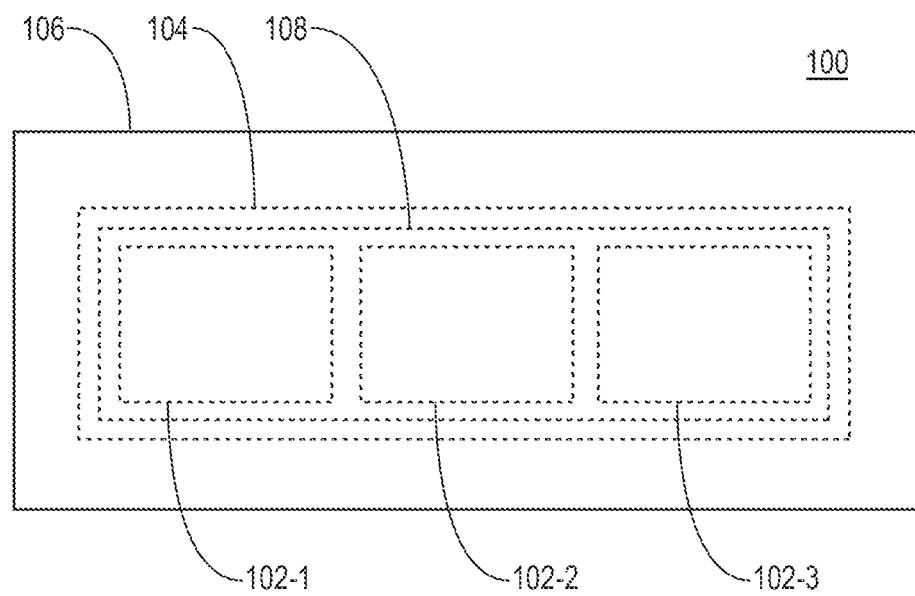
FIG. 1C illustrates a top view perspective of the power module package according to an aspect.

FIGS. 1A through 1C illustrate a power module package 100 for direct cooling multiple power modules 102. FIG. 1A illustrates a cross sectional view of the power module package 100. The power module package 100 includes a plurality of power modules 102, a plurality of heat sinks 110 coupled to the power modules 102, a module carrier 104 coupled to the power modules 102, a housing 106 coupled to the module carrier 104, and a ring member 108 located (e.g., disposed) between the module carrier 104 and the housing 106.

FIG. 1B illustrates an enlarged view of the module carrier 104. The module carrier 104 is disposed between the power modules 102 and the housing 106, where the module carrier 104 defines a number of heat-sink slots (e.g., 120-1, 120-2, 120-3) that receive (and align) a separate heat sink 110. FIG. 1C illustrates a top view perspective of the power module package 100 that depicts the ring member 108 extending around the power modules 102, collectively. In some examples, the power module package 100 includes a single ring member 108. The ring member 108 may be disposed between the module carrier 104 and the housing 106 and may assist with sealing a chamber 124 of the housing 106.

The power module package 100 may be a high-voltage power package. In some examples, the power module package 100 may operate at voltages greater than one thousand volts. The amount of heat generated by the power modules 102 is reduced by injecting a cooling fluid into the chamber 124 of the housing 106. The cooling fluid may include cooled gas such as air and/or cooled liquid such as a cooling fluid and/or cooling mixture. The power modules 102 are directly cooled by the cooling fluid. Direct cooling involves the application of a cooling fluid directly on a portion of a power module 102 (e.g., a backside of a power module 102 such as a heat sink 110 coupled (e.g., directly coupled) to the power module 102). For example, since heat sinks 110 are coupled (e.g., directly coupled) to the power module 102, the application of cooling fluid to the heat sinks 110 within the chamber 124 directly cools the power modules 102. In contrast, indirect cooling involves the application of a cooling fluid to a component that is sealed from one or more power modules. The power module package 100 may be relatively compact, robust, and relatively simple to assemble. In some examples, instead of individually sealing each power module for direct cooling, the power module package 100 uses a module carrier 104 that can seal, collectively, multiple power modules 102 in a compact fashion.

A power module 102 includes one or more silicon powered dies soldered onto one or more substrates, which can be direct bonded copper (DBC) metalized ceramics soldered onto a base plate (e.g., a copper plate). In some examples, a power module 102 includes one or more silicon-based power chips (e.g., insulated-gate bipolar transistor(s) (IGBTs), metal oxide silicon field effect transistor(s) (MOSFETs), diodes, etc.) that are soldered onto a ceramic-based substrate, which is then soldered to a base plate. In some examples, the power modules 102 include half-bridge modules (e.g., an inverter leg with two switches and their corresponding antiparallel diodes). However, the power modules 102 may include other types of module topologies such as switch, bridge rectifier, H-bridge, etc.

In some examples, the power module package 100 includes half bridge direct cooling modules that are integrated on an inverter. In some examples, the power module package 100 includes a three-phase inverter circuit (e.g., a 6-pack module or IGBT 6-pack module). In some examples, the power module package 100 is configured to be used within an automotive inverter for an electric vehicle or a hybrid vehicle. For example, an automotive inverter may accelerate or decelerate the vehicle by converting the direct current (DC) power from the batteries to alternating current (AC) at the frequency required for vehicle speed and other system controls to control the electric motor speed, drive, torque, and/or power. In some examples, the housing 106 is the housing of the automotive inverter.

The power modules 102 include a first power module 102-1 and a second power module 102-2. In some examples, the first power module 102-1 is a half-bridge power module. In some examples, the second power module 102-2 is a half-bridge power module. In some examples, the power modules 102 include a third power module 102-3. In some examples, the third power module 102-3 is a half-bridge power module. In some examples, the power module package 100 includes two power modules 102. In some examples, the power module package 100 includes three power modules 102. In some examples, the power module package 100 includes more than three power modules 102. In some examples, each of the first power module 102-1, the second power module 102-2, and the third power module 102-3 correspond to a separate phase of a three-phase current (UVM) of an inverter. In some examples, the first power module 102-1, the second power module 102-2, and the third power module 102-3, collectively, operate as a 6-pack full bridge module.

Each of the power modules 102 include a first surface 111 and a second surface 113. The distance between the first surface 111 and the second surface 113 may define a thickness of a respective power module 102 in a direction A1. Each power module 102 is connected to a separate heat sink 110. In some examples, each power module 102 is connected to a separate heat sink 110 using an adhesive material (e.g., a polymer-based material, solder material, glue material, etc.). The first power module 102-1 is coupled to a first heat sink 110-1, the second power module 102-2 is coupled to a second heat sink 110-2, and the third power module 102-3 is coupled to a third heat sink 110-3. In further detail, the first heat sink 110-1 is coupled to the second surface 113 of the first power module 102-1, the second heat sink 110-2 is coupled to the second surface 113 of the second power module 102-2, and the third heat sink 110-3 is coupled to the second surface 113 of the third power module 102-3.

The first heat sink 110-1 extends from the second surface 113 of the first power module 102-1 in the direction A1. The second heat sink 110-2 extends from the second surface 113 of the second power module 102-2 in the direction A1. The third heat sink 110-3 extends from the second surface 113 of the third power module 102-3 in the direction A1. In some examples, the first heat sink 110-1 includes a pin fin heat sink. In some examples, the second heat sink 110-2 includes a pin fin heat sink. In some examples, the third heat sink 110-3 includes a pin fin heat sink. In some examples, a pin fin heat sink includes a base plate that is coupled to the second surface 113 of a respective power module 102, and a plurality of pin fins that extend in the direction A1.

Each power module 102 is coupled to the module carrier 104 via an adhesive material 112. In some examples, the adhesive material 112 includes a polymer-based material. In some examples, the adhesive material 112 includes a solder material. In some examples, the adhesive material 112 includes a glue material. In some examples, the adhesive material 112 includes a transient liquid phase sintering (TLPS) material. The module carrier 104 includes a first surface 115 and a second surface 117. In some examples, the second surface 117 is parallel with the first surface 115. The distance between the first surface 115 and the second surface 117 may define the thickness of the module carrier 104 in the direction A1. The first surface 115 of the module carrier 104 is coupled to the second surface 113 of each of the first power module 102-1, the second power module 102-2, and the third power module 102-3. The first surface 115 is disposed in a plane A4. The direction A1 is aligned perpendicular to the plane A4, and a direction A2 is perpendicular to the direction A1. A direction A3 is orthogonal to directions A1 and A2. As shown in FIG. 1A, the direction A3 is depicted into the page (shown as a dot). However, since FIG. 1B is a top of the module carrier 104, the direction A1 on FIG. 1B is depicted into the page (as shown as a dot).

The chamber 124 may be sealed from the power modules 102 via the module carrier 104. In other words, the sealing may not be directly on the DBC material of the power modules 102, but rather the sealing is created using the module carrier 104. The module carrier 104 is a single (integral) body defining a number of heat-sink slots, where the number of heat-sink slots corresponds to the number of power modules 102. The module carrier 104 is disposed between the power modules 102 and the housing 106. In some examples, the module carrier 104 may enable relatively easy integration with the housing 106. In some examples, the module carrier 104 is a middle plate. In some examples, the module carrier 104 includes a plastic material. In some examples, the module carrier 104 includes a metal-based material. In some examples, the module carrier 104 includes an aluminum material. In some examples, the module carrier 104 includes a copper material. The module carrier 104 has a length that extends in the direction A2, a width that extends in the direction A3, and a thickness that extends in the direction A1. In some examples, the module carrier 104 has a rectangle shape. However, the module carrier 104 may include other types of shapes including curve and/or rounded portions.

As shown in FIG. 1B, the module carrier 104 includes a first region 114-1, a second region 114-2, and a third region 114-3. The first region 114-1 is the portion of the module carrier 104 in which the first power module 102-1 is mounted. The second region 114-2 is the portion of the module carrier 104 in which the second power module 102-2 is mounted. The third region 114-3 is the portion of the module carrier 104 in which the third power module 102-3 is mounted. In some examples, if the module carrier 104 integrates three power modules 102, the module carrier 104 may have a total of three regions, were each region has the same size. In some examples, one region may be larger than another region if a power module 102 is larger than another power module 102.

The first region 114-1 defines a heat-sink slot 120-1. The size (e.g., in the directions A2 and A3) of the heat-sink slot 120-1 is smaller than the size (e.g., in the directions A2 and A3) of the first region 114-1. The second region 114-2 defines a heat-sink slot 120-2. The size (e.g., in the directions A2 and A3) of the heat-sink slot 120-2 is smaller than the size (e.g., in the directions A2 and A3) of the second region 114-2. The third region 114-3 defines a heat-sink slot 120-3. The size (e.g., in the directions A2 and A3) of the heat-sink slot 120-3 is smaller than the size (e.g., in the directions A2 and A3) of the third region 114-3.

The module carrier 104 includes a portion 126 that separates the heat-sink slot 120-1 from the heat-sink slot 120-2. The module carrier 104 includes a portion 128 that separates the heat-sink slot 120-3 from the heat-sink slot 120-2. The module carrier includes a perimeter area portion 118 that extends around the heat-sink slot 120-1, the heat-sink slot 120-2, and the heat-sink slot 120-3, collectively. In some examples, the perimeter area portion 118 is coupled to the housing 106. The heat-sink slot 120-1 has a size that is larger (e.g., slightly larger) than a size of the first heat sink 110-1, and the heat-sink slot 120-1 has a size that is smaller than a size of the first power module 102-1. The heat-sink slot 120-2 has a size that is larger (e.g., slightly larger) than a size of the second heat sink 110-2, and the heat-sink slot 120-2 has a size that is smaller than a size of the second power module 102-2. The heat-sink slot 120-3 has a size that is larger (e.g., slightly larger) than a size of the third heat sink 110-3, and the heat-sink slot 120-3 has a size that is smaller than a size of the third power module 102-3. Each of the heat-sink slots (120-1, 120-2, 120-3) extends between (and through) the first surface 115 of the module carrier 104 and the second surface 117 of the module carrier 104.

The first region 114-1 is coupled to the first power module 102-1 such that the first heat sink 110-1 at least partially extends (or fully extends) through the heat-sink slot 120-1 and into the chamber 124 of the housing 106. The second region 114-2 is coupled to the second power module 102-2 such that the second heat sink 110-2 at least partially extends (or fully extends) through the heat-sink slot 120-2 and into the chamber 124 of the housing 106. The third region 114-3 is coupled to the power module 103-3 such that the third heat sink 110-3 at least partially extends (or fully extends) through the heat-sink slot 120-4 and into the chamber 124 of the housing 106.

As shown in FIG. 1B, the first region 114-1 may define a positioning guide 116-1 that aligns at least one of the first power module 102-1 or the first heat sink 110-1 during assembly of the power module package 100. In some examples, the positioning guide 116-1 is located on (or defined by) the first region 114-1 at a location proximate to the heat-sink slot 120-1. In some examples, the positioning guide 116-1 is a feature of the heat-sink slot 120-1. In some examples, the positioning guide 116-1 is a surface feature that interacts with a surface feature of the first power module 102-1 to cause the first power module 102-1 to be aligned with the first region 114-1 of the module carrier 104. In some examples, the positioning guide 116-1 is a surface feature that interacts with a surface feature of the first heat sink 110-1 to cause the first heat sink 110-1 to be properly aligned within the heat-sink slot 120-1. In some examples, the positioning guide 116-1 includes one or more protrusions. In some examples, the positioning guide 116-1 includes one or more grooves. In some examples, the positioning guide 116-1 includes one or more slots.

The second region 114-2 may define a positioning guide 116-2 that aligns at least one of the second power module 102-2 or the second heat sink 110-2. In some examples, the positioning guide 116-2 is located on (or defined by) the second region 114-2 at a location proximate to the heat-sink slot 120-2. In some examples, the positioning guide 116-2 is a feature of the heat-sink slot 120-2. In some examples, the positioning guide 116-2 is a surface feature that interacts with a surface feature of the second power module 102-2 to cause the second power module 102-2 to be aligned with the second region 114-2 of the module carrier 104. In some examples, the positioning guide 116-2 is a surface feature that interacts with a surface feature of the second heat sink 110-2 to cause the second heat sink 110-2 to be properly aligned within the heat-sink slot 120-2. In some examples, the positioning guide 116-2 includes one or more protrusions. In some examples, the positioning guide 116-2 includes one or more grooves. In some examples, the positioning guide 116-2 includes one or more slots.

The third region 114-3 may define a positioning guide 116-3 that aligns at least one of the third power module 102-3 or the third heat sink 110-3. In some examples, the positioning guide 116-3 is located on (or defined by) the third region 114-3 at a location proximate to the heat-sink slot 120-3. In some examples, the positioning guide 116-3 is a feature of the heat-sink slot 120-3. In some examples, the positioning guide 116-3 is a surface feature that interacts with a surface feature of the third power module 102-3 to cause the third power module 102-3 to be aligned with the third region 114-3 of the module carrier 104. In some examples, the positioning guide 116-3 is a surface feature that interacts with a surface feature of the third heat sink 110-3 to cause the third heat sink 110-3 to be properly aligned with the heat-sink slot 120-3. In some examples, the positioning guide 116-3 includes one or more protrusions. In some examples, the positioning guide 116-3 includes one or more grooves. In some examples, the positioning guide 116-3 includes one or more slots.

The housing 106 is coupled to the module carrier 104, where the module carrier 104 is positioned between the housing 106 and the power modules 102. In some examples, the housing 106 is coupled to the module carrier 104 via one or more fasteners. In some examples, the housing 106 is coupled to the module carrier 104 by welding (e.g., laser welding). In some examples, the housing 106 includes a plastic material. The housing 106 defines a chamber 124, where cooling fluid is injected into the chamber 124 via an opening 125 and expelled from the chamber 124 via an opening 125. Each of the first heat sink 110-1, the second heat sink 110-2, and the third heat sink 110-3 includes a portion that is disposed within the chamber 124. In some examples, the housing 106 is an inverter housing. In some examples, the housing 106 is an inverter housing for a vehicle.

The power module package 100 includes a ring member 108 that is located (e.g., disposed) between the housing 106 and the module carrier 104. The ring member 108 includes a portion that contacts the housing and a portion that contacts the module carrier 104. In some examples, the housing 106 may define a groove, and the ring member 108 is positioned in the groove between the housing 106 and the module carrier 104. The ring member 108 extends around the first power module 102-1, the second power module 102-2, and the third power module 102-3, collectively. In some examples, the ring member 108 includes an O-ring. In some examples, the power module package 100 includes a single ring member 108.

Figure 2A:
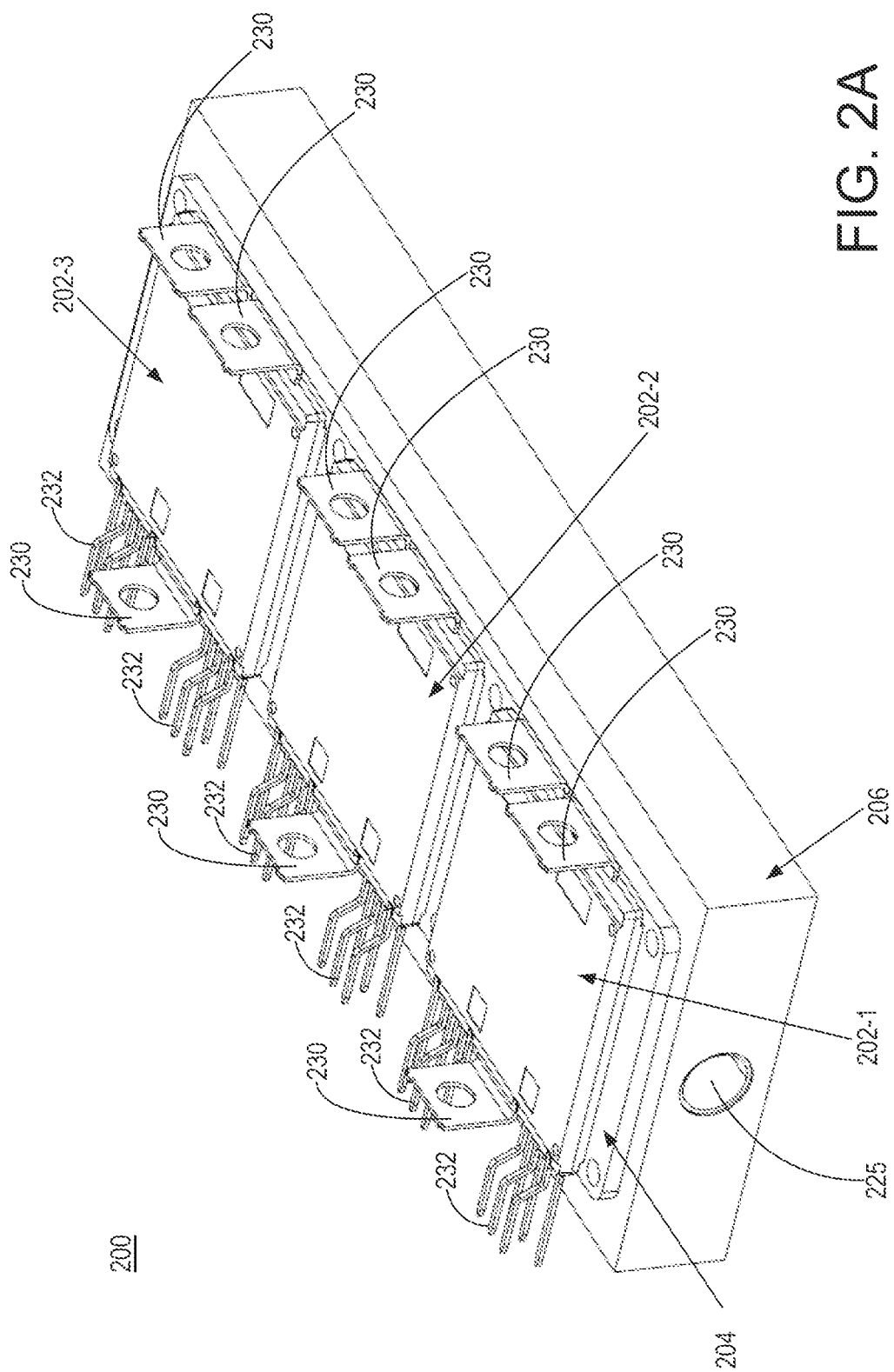
FIGS. 2A through 2F illustrate a power module package according to an aspect.
Figure 2B:
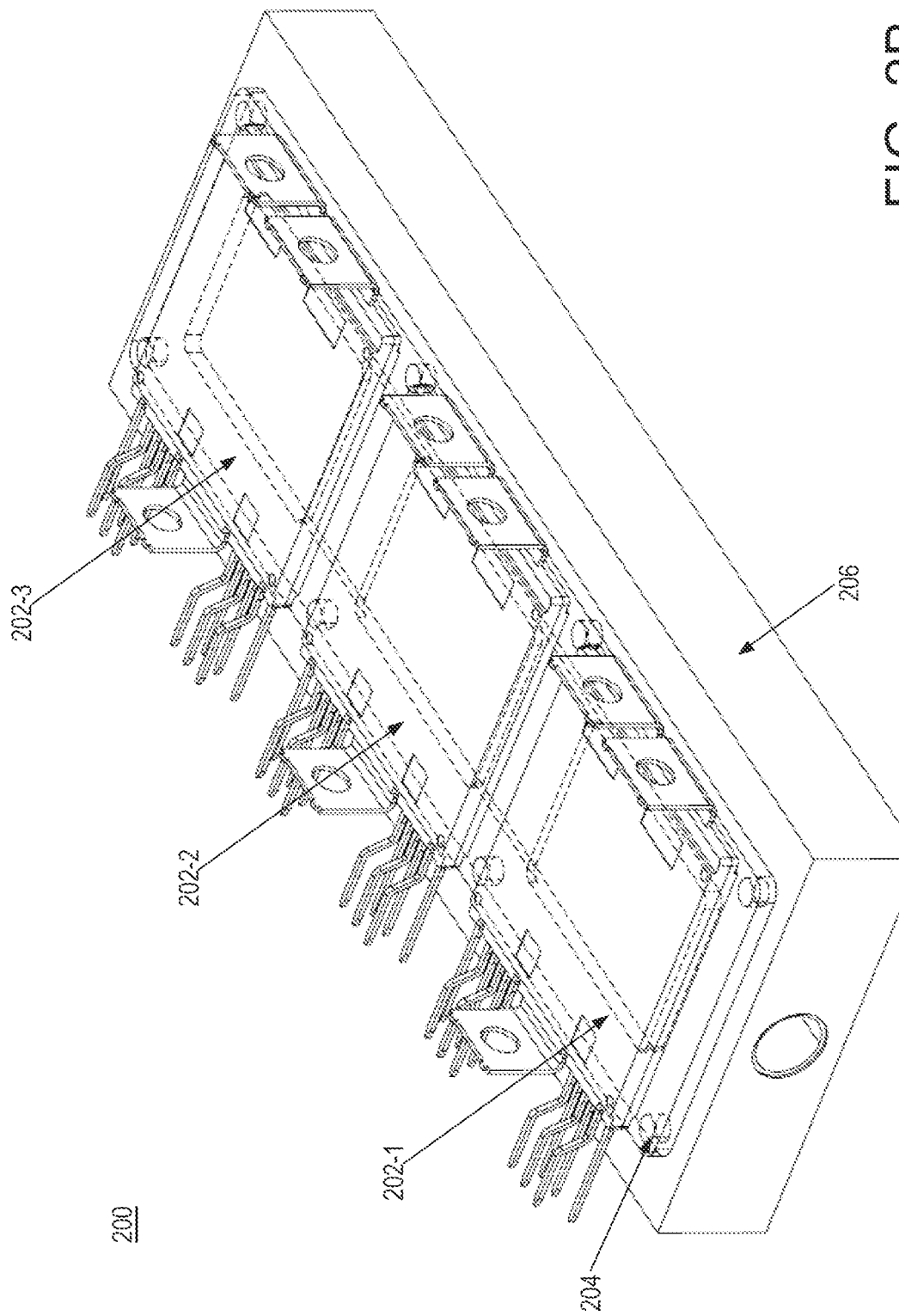
Figure 2C:
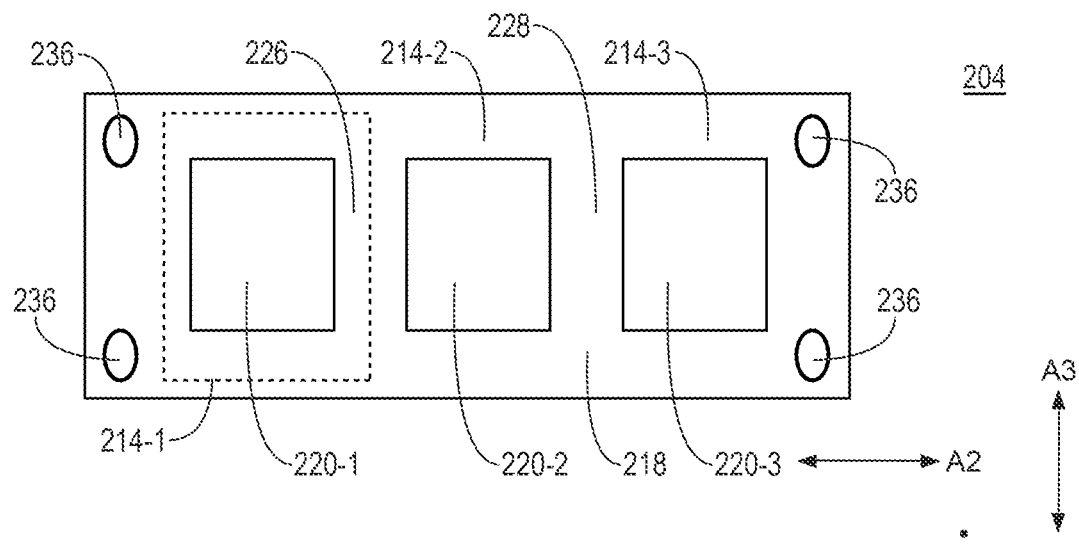
Figure 2D:
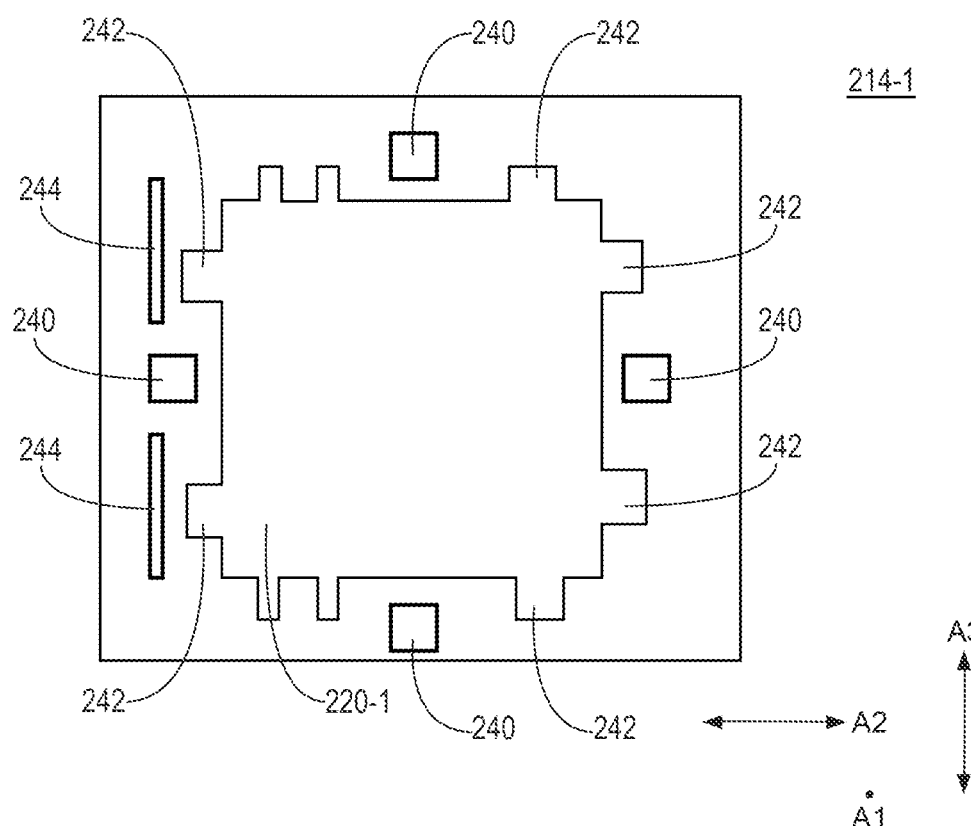
Figure 2E:
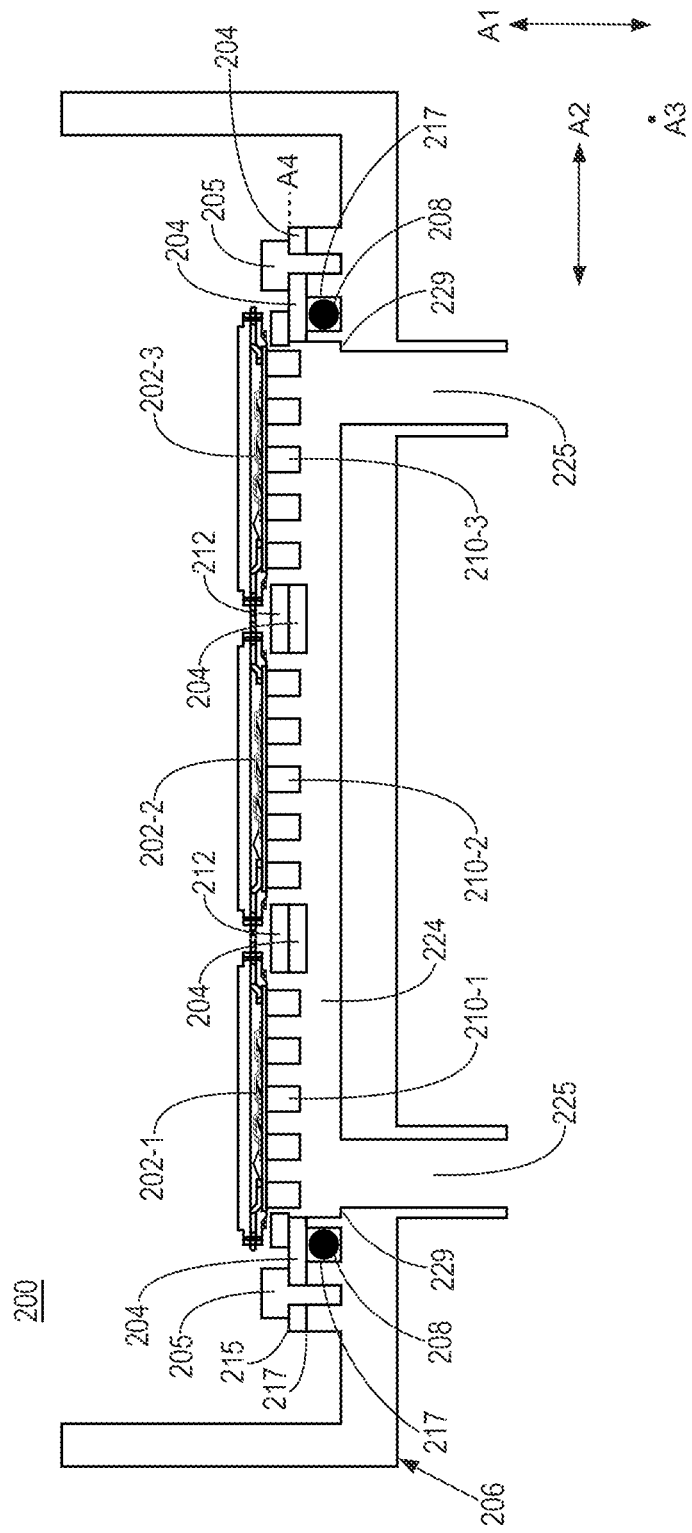
Figure 2F:
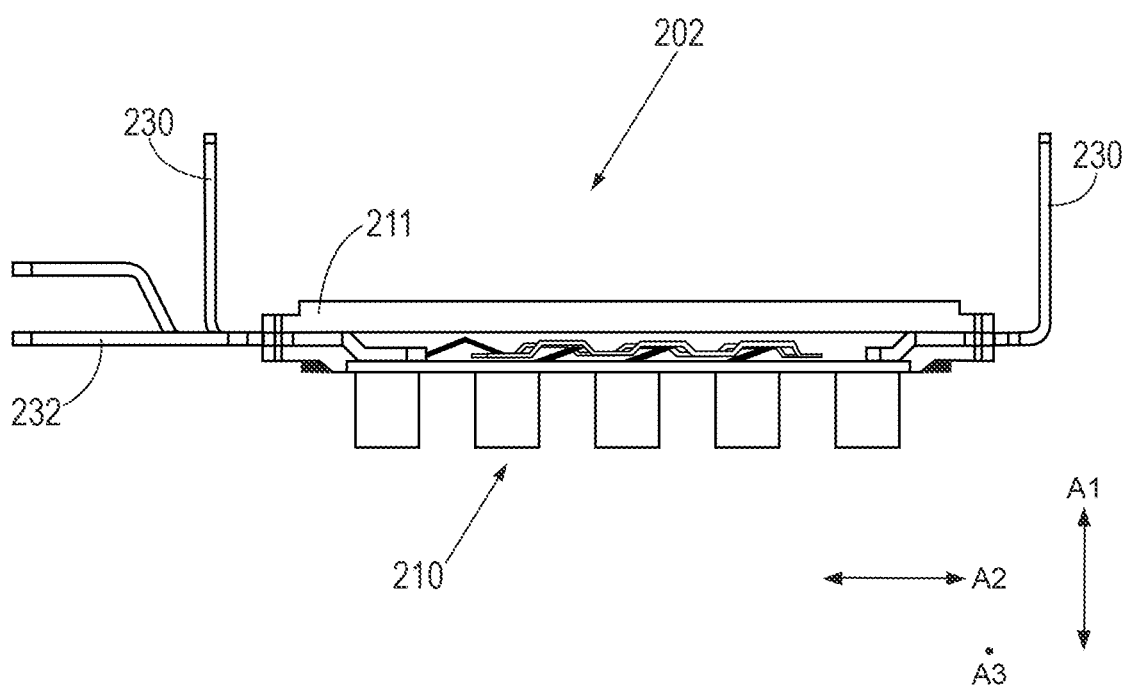

FIGS. 2A through 2F illustrate a power module package 200 for direct cooling multiple power modules 202. The power module package 200 may be an example of the power module package 100 of FIGS. 1A through 1C. The power module package 200 includes a plurality of power modules 202, a plurality of heat sinks 210 coupled to the power modules 202, a module carrier 204 coupled to the power modules 202, a housing 206 coupled to the module carrier 204, and a ring member 208 located (e.g., disposed) between the module carrier 204 and the housing 206. FIG. 2A illustrates a perspective of the power module package 200. FIG. 2B illustrates a perspective of the power module package 200 with the power modules 202 being transparent. FIG. 2C illustrates a top view perspective of the module carrier 204. FIG. 2D illustrates a region of the module carrier 204. FIG. 2E illustrates a cross sectional view of the power module package 200. FIG. 2F illustrates a side view of a power module 202.

The power modules 202 include a first power module 202-1, a second power module 202-2, and a third power module 202-3. In some examples, each of the first power module 202-1, the second power module 202-2, and the third power module 202-3 correspond to a separate phase of a three-phase current (UVM) of an inverter. In some examples, the first power module 202-1, the second power module 202-2, and the third power module 202-3, collectively, operate as a 6-pack full bridge module. In some examples, the power modules 202 includes terminals 230 and contacts 232. In some examples, the terminals 230 extend in the direction A1, and the contacts 232 extend in the direction A2.

As shown in FIG. 2F, a power module 202 includes a first surface 211 and a second surface 213. The distance between the first surface 211 and the second surface 213 may define a thickness of a respective power module 202 in a direction A1. Each power module 202 is connected to a separate heat sink 210. In some examples, each power module 202 is connected to a separate heat sink 210 using an adhesive material. The first power module 202-1 is coupled to a first heat sink 210-1, the second power module 202-2 is coupled to a second heat sink 210-2, and the third power module 202-3 is coupled to a third heat sink 210-3. In further detail, the first heat sink 210-1 is coupled to the second surface 213 of the first power module 202-1, the second heat sink 210-2 is coupled to the second surface 213 of the second power module 202-2, and the third heat sink 210-3 is coupled to the second surface 213 of the third power module 202-3.

The first heat sink 210-1 extends from the second surface 213 of the first power module 202-1 in the direction A1. The second heat sink 210-2 extends from the second surface 213 of the second power module 202-2 in the direction A1. The third heat sink 210-3 extends from the second surface 213 of the third power module 202-3 in the direction A1. Each of the first heat sink 210-1, the second heat sink 210-2, and the third heat sink 210-3 includes a pin fin heat sink.

Each power module 202 is coupled to the module carrier 204 via an adhesive material 212. The module carrier 204 includes a first surface 215 and a second surface 217. In some examples, the second surface 217 is parallel with the first surface 215. The distance between the first surface 215 and the second surface 217 may define the thickness of the module carrier 204 in the direction A1. The first surface 215 of the module carrier 204 is coupled to the second surface 213 of each of the first power module 202-1, the second power module 202-2, and the third power module 202-3. The first surface 215 is disposed in a plane A4.

The chamber 224 may be sealed from the power modules 202 via the module carrier 204. In other words, the sealing may not be directly on the DBC material of the power modules 102. The module carrier 204 is a single (integral) body defining a number of heat-sink slots, where the number of heat-sink slots corresponds to the number of power modules 202. The module carrier 204 is disposed between the power modules 202 and the housing 206. In some examples, the module carrier 204 is a middle plate. In some examples, the module carrier 204 includes a plastic material. In some examples, the module carrier 204 includes a metal-based material. In some examples, the module carrier 204 includes an aluminum material. In some examples, the module carrier 204 includes a copper material. The module carrier 204 has a length that extends in the direction A2, a width that extends in the direction A3, and a thickness that extends in the direction A1. In some examples, the module carrier 204 has a rectangle shape. However, the module carrier 204 may include other types of shapes includes curved or rounded portions.

As shown in FIG. 2C, the module carrier 104 includes a first region 214-1, a second region 214-2, and a third region 214-3. The first region 214-1 defines a heat-sink slot 220-1. The second region 214-2 defines a heat-sink slot 220-2. The third region 214-3 defines a heat-sink slot 220-3. The module carrier 204 includes a portion 226 that separates the heat-sink slot 220-1 from the heat-sink slot 220-2. The module carrier 204 includes a portion 228 that separates the heat-sink slot 220-3 from the heat-sink slot 220-2. The module carrier 204 includes a perimeter area portion 218 that extends around the heat-sink slot 220-1, the heat-sink slot 220-2, and the heat-sink slot 220-3, collectively. In some examples, the module carrier 204 defines openings 236 that are used to fasten the module carrier 204 to the housing 206. In some examples, the openings 236 are defined on the perimeter area portion 218 at the corner portions of the module carrier 204. As shown in FIG. 2E, fasteners 205 may extend through the openings 236 and into the housing 206. In some examples, fasteners 205 are not used, but rather the module carrier 204 is coupled to the housing 206 via other coupling mechanisms such as welding (e.g., laser welding.

The heat-sink slot 220-1 has a size that is larger than a size of the first heat sink 210-1, and the heat-sink slot 220-1 has a size that is smaller than a size of the first power module 202-1. The heat-sink slot 220-2 has a size that is larger than a size of the second heat sink 210-2, and the heat-sink slot 220-2 has a size that is smaller than a size of the second power module 202-2. The heat-sink slot 220-3 has a size that is larger than a size of the third heat sink 210-3, and the heat-sink slot 220-3 has a size that is smaller than a size of the third power module 202-3. Each of the heat-sink slots (220-1, 220-2, 220-3) extends between (and through) the first surface 215 of the module carrier 204 and the second surface 217 of the module carrier 204.

The first region 214-1 is coupled to the first power module 202-1 such that the first heat sink 210-1 extends through the heat-sink slot 220-1 and into the chamber 224 of the housing 206. The second region 214-2 is coupled to the second power module 202-2 such that the second heat sink 210-2 extends through the heat-sink slot 220-2 and into the chamber 224 of the housing 206. The third region 214-3 is coupled to the power module 203-3 such that the third heat sink 210-3 extends through the heat-sink slot 220-4 and into the chamber 224 of the housing 206.

As shown in FIG. 2D, in some examples, the first region 214-1 may define module positioning guides 240. The module positioning guides 240 may be an example of the positioning guide 116-1 of FIG. 1B. The module positioning guides 240 are surface features configured to interact with surface features on the first power module 202-1 to properly align the first power module 202-1 with the first region 214-1. Although four module positioning guides 240 are depicted in FIG. 2D, the first region 214-1 may define any number of module positioning guides 240. In some examples, the module positioning guides 240 include protrusions that extend from the second surface 217 of the module carrier 204, where the protrusions interact with slots defined by the first power module 202-1. In some examples, the module positioning guides 240 include slots that extend into the second surface 217 of the module carrier 204, where the slots interact with protrusions defined by the first power module 202-1.

In some examples, the first region 214-1 may include heat-sink positioning guides 242. The heat-sink positioning guides 242 may be an example of the positioning guide 116-1 of FIG. 1B. In some examples, the first region 214-1 includes the module positioning guides 240 but not the heat-sink positioning guides 242. In some examples, the first region 214-1 includes the heat-sink positioning guides 242 but not the module positioning guides 242. In some examples, the first region 214-1 includes the module positioning guides 240 and the heat-sink positioning guides 242.

The heat-sink positioning guides 242 are surface features configured to interact with surface features on the first heat sink 210-1 to properly align the first heat sink 210-1 within the heat-sink slot 220-1. Although six heat-sink positioning guides 242 are depicted in FIG. 2D, the first region 214-1 may define any number of heat-sink positioning guides 242. In some examples, the heat-sink positioning guides 242 include slots that extend from the first heat-sink slot 220-1. The second region 214-2 and the third region 214-3 may include the same features as discussed with reference to the first region 214-1. In some examples, the first region 214-1 includes one or more adhesive stop features 244. In some examples, the adhesive stop features 244 are slots that extend into the first region 214-1 (e.g., having a certain depth). The adhesive stop features 244 may accept adhesive overflow during the assembly process.

The housing 206 is coupled to the module carrier 204, where the module carrier 204 is positioned between the housing 206 and the power modules 202. In some examples, the housing 206 is coupled to the module carrier 204 via one or more fasteners 205. In some examples, the housing 206 is coupled to the module carrier 204 by welding (e.g., laser welding). In some examples, the housing 206 includes a plastic material. The housing 206 defines a chamber 224, where cooling fluid is injected into the chamber 224 via an opening 225 and expelled from the chamber 224 via an opening 225. Each of the first heat sink 210-1, the second heat sink 210-2, and the third heat sink 210-3 includes a portion that is disposed within the chamber 224. In some examples, the housing 206 is an inverter housing. In some examples, the housing 206 is an inverter housing for a vehicle.

The power module package 200 includes a ring member 208 that is located (e.g., disposed) between the housing 206 and the module carrier 204. The ring member 208 includes a portion that contacts the housing and a portion that contacts the module carrier 204. In some examples, the housing 206 may define a groove 271, and the ring member 208 is positioned in the groove 271 between the housing 206 and the module carrier 204. The ring member 208 extends around the first power module 202-1, the second power module 202-2, and the third power module 202-3, collectively. In some examples, the ring member 208 includes an O-ring. In some examples, the power module package 200 includes a single ring member 208.

Figure 3:
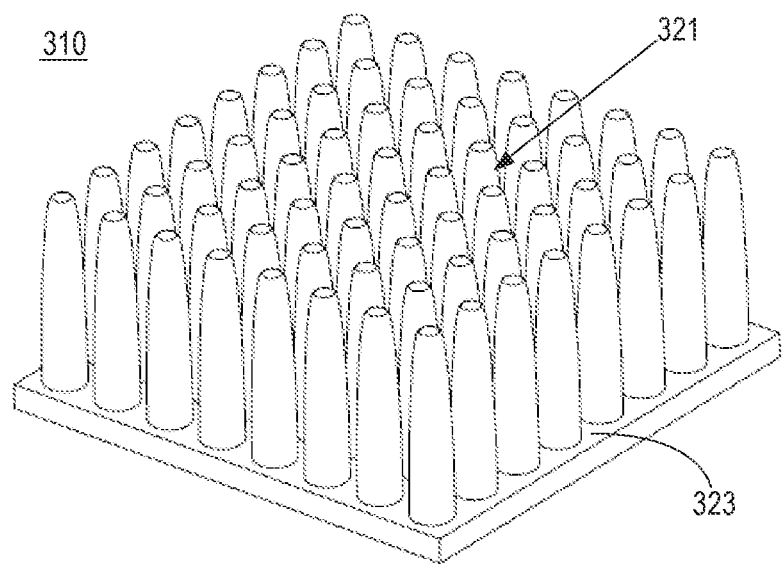
FIGS. 3 and 4 illustrate examples of a heat sink according to several aspects.
Figure 4:
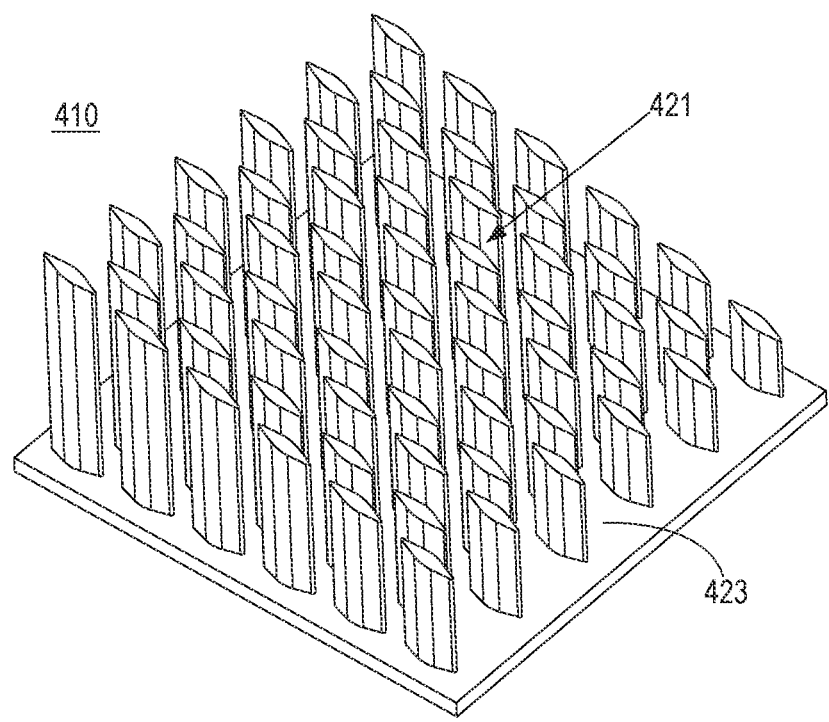

FIG. 3 illustrates an example of a heat sink 310. The heat sink 310 may be any of the heat sinks discussed with reference to the previous figures. The heat sink 310 is a pin fin heat sink. For example, the heat sink 310 includes a base plate 323 and a plurality of pin fins 321 that extend from the base plate 323. In some examples, as shown in FIG. 3, the pin fins 321 have the same length. FIG. 4 illustrates an example of a heat sink 410. The heat sink 410 may be any of the heat sinks discussed with reference to the previous figures. The heat sink 410 is a pin fin heat sink. For example, the heat sink 410 includes a base plate 423 and a plurality of pin fins 421 that extend from the base plate 423. In some examples, as shown in FIG. 4, the pin fins 421 have different lengths.

Figure 5A:
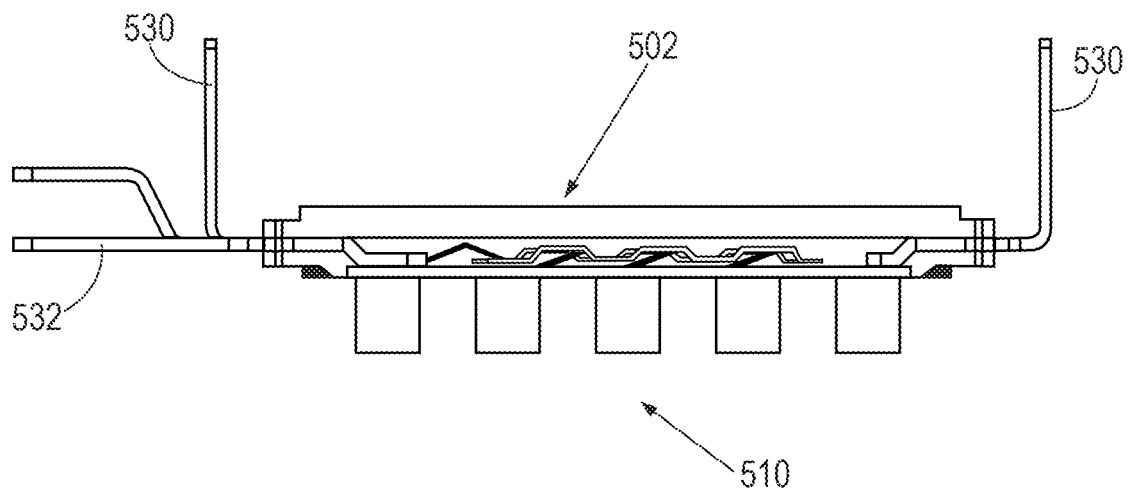
FIG. 5A through 5F illustrate a power module package that is assembled according to an aspect.
Figure 5B:
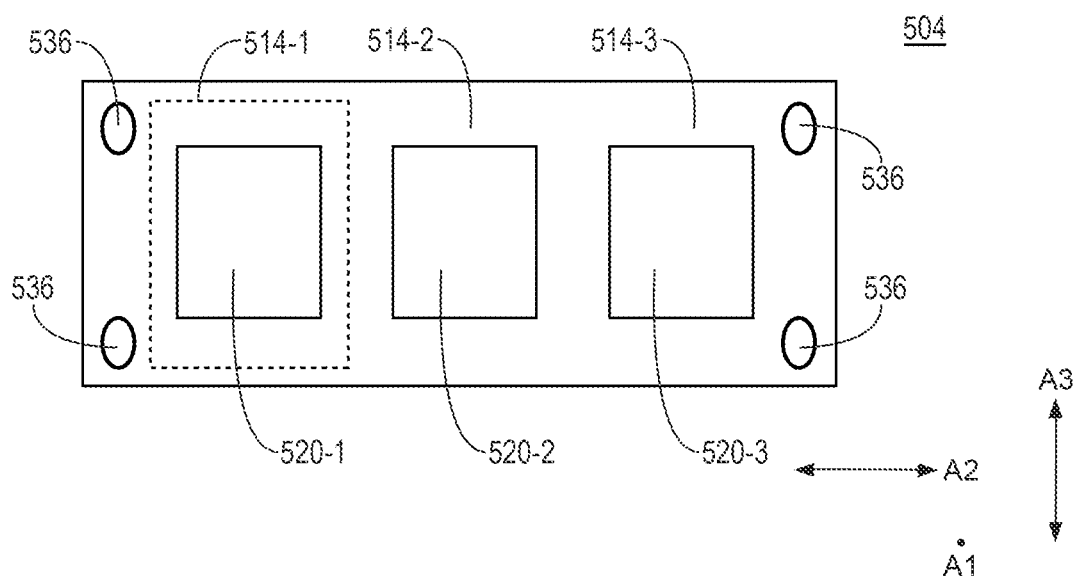
Figure 5C:
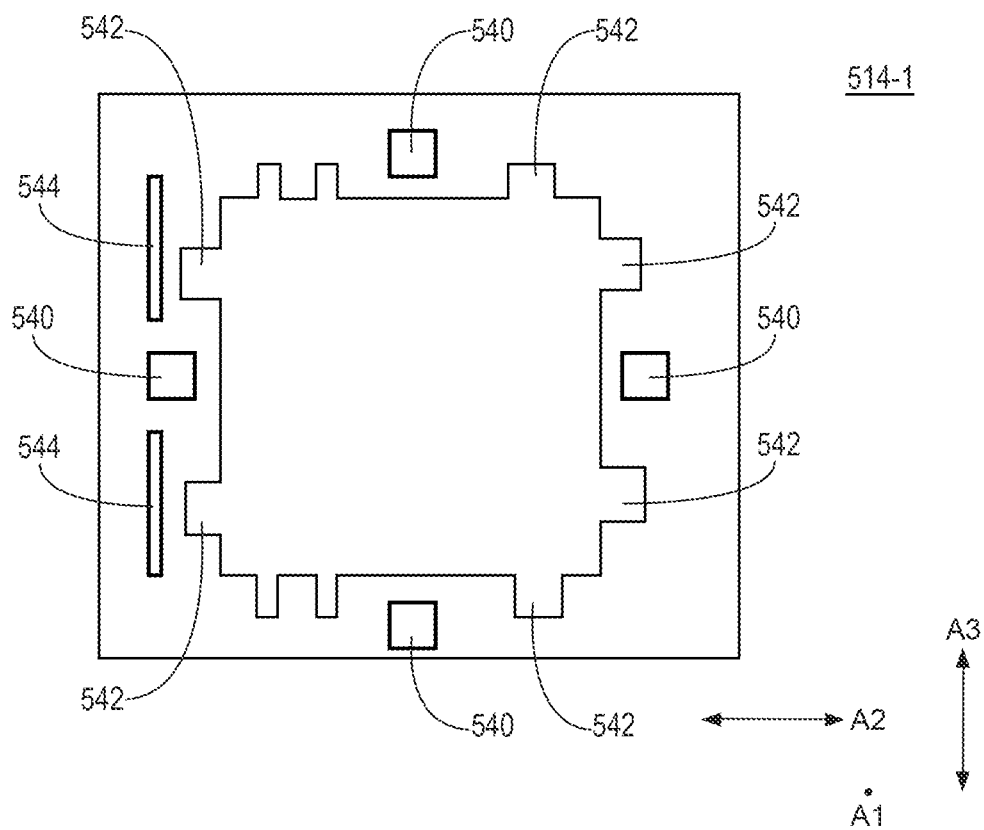
Figure 5D:
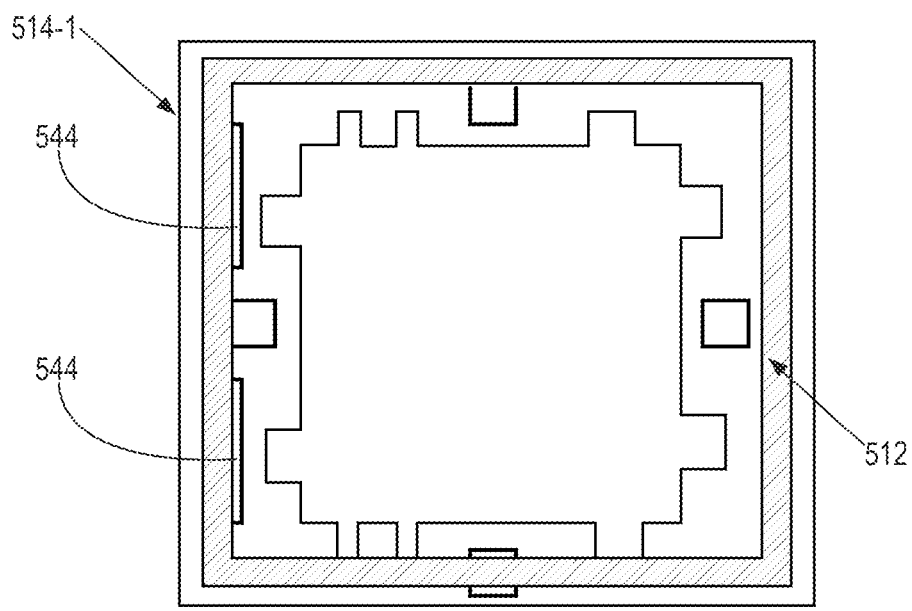
Figure 5E:
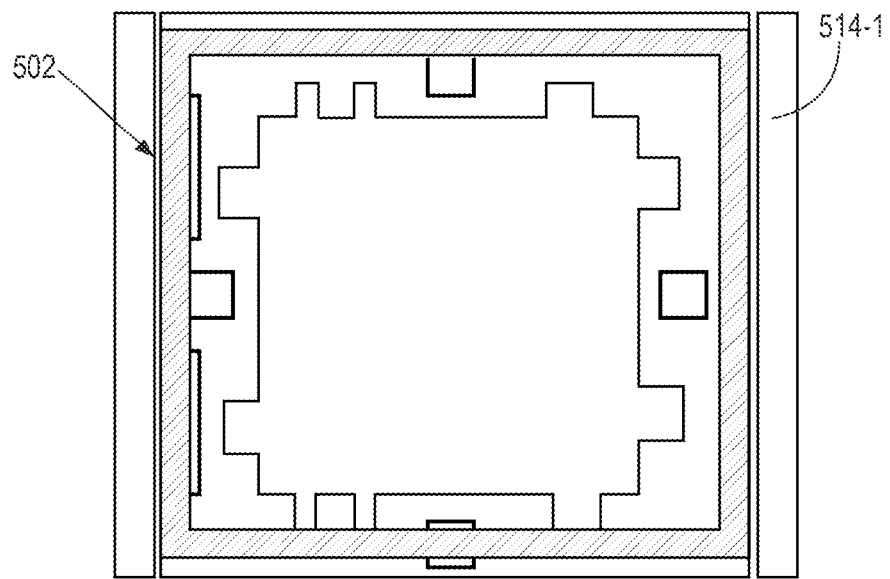
Figure 5F:
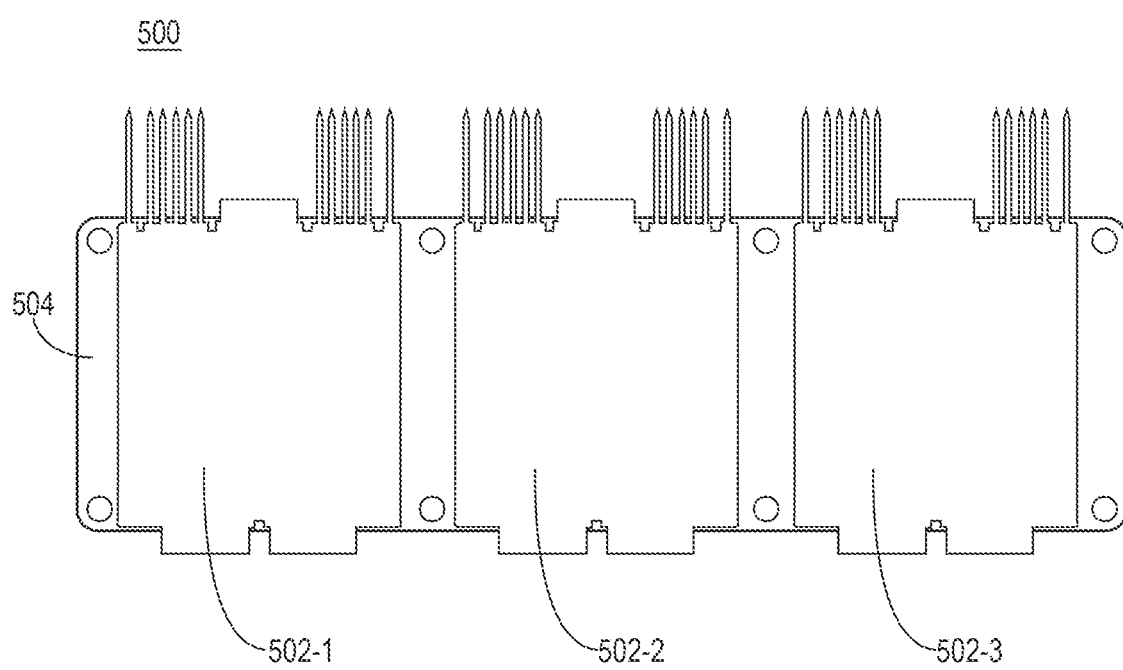

FIGS. 5A through 5F illustrate a power module package 500 that is assembled according to a first assembly process. The power module package 500 may be an example of any of the power module packages discussed with reference to the previous figures. FIG. 5A illustrates a power module 502 with an attached heat sink 510, which may be an example of a first power module 502-1, a second power module 502-2, and a third power module 502-3. Also, the power module 502 includes terminals 530 and contacts 532. FIG. 5B illustrates a module carrier 504 defining a first region 514-1, a second region 514-2, and a third region 514-3. The first region 514-1 defines a first heat-sink slot 520-1. The second region 514-2 defines a second heat-sink slot 520-2. The third region 514-3 defines a third heat-sink slot 520-3. Also, the module carrier 504 may include a plurality of openings 536. FIG. 5C illustrates a perspective of the first region 514-1 that defines module positioning guides 540, heat-sink positioning guides 542, and/or adhesive stop features 544. FIG. 5D illustrates an adhesive material 512 applied to the first region 514-1, where the adhesive stop features 544 accept adhesive overflow from the application of the adhesive material 512 to the first region 514-1. FIG. 5E illustrates the power module 502 coupled to the first region 514-1. FIG. 5F illustrates a first power module 502-1, a second power module 502-2, and a third power module 502-3 coupled to the module carrier 504 after the adhesive material 512 is cured.

Before the first assembly process starts, the heat sinks 510 are already coupled to the power modules 502. With respect to the first region 514-1, an adhesive material 512 is applied to the first region 514-1. Then, the heat sink 510 that is coupled to the first power module 502-1 is inserted into the first heat-sink slot 520-1, where the heat-sink positioning guides 542 guide the heat sink 510 through the heat-sink slot 520-1 such that the first power module 502-1 contacts the adhesive material 512. The same process happens with respect to the second region 514-2 and the third region 514-2. For example, the adhesive material 512 is applied to the first region 514-1, the second region 514-2, and the third region 514-3. Then, the first power module 502-1, the second power module 502-2, and the third power module 502-3 are positioned on the module carrier 504 in the same manner as discussed with reference to the first region 514-1. Then, the module carrier 504 with the first power module 502-1, the second power module 502-2, and the third power module 502-3 may be cured (e.g., oven cured) to cure the adhesive material 512.

Figure 6:
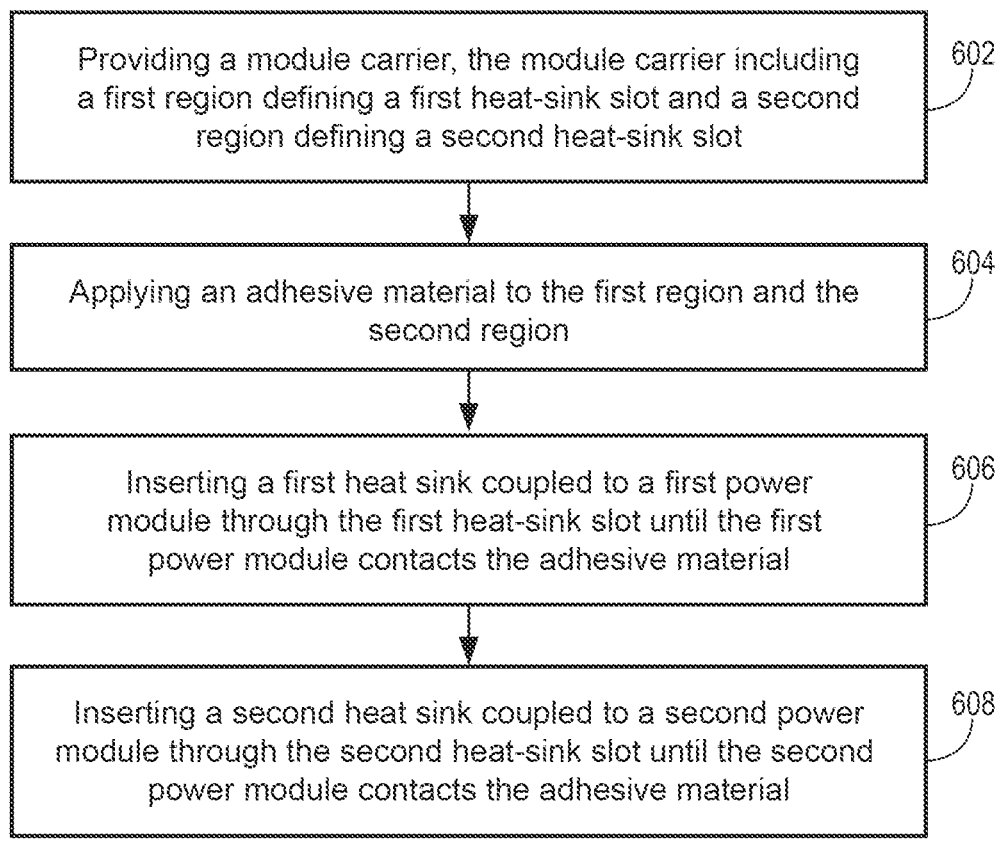
FIG. 6 illustrates a flowchart depicting example operations for assembling a power module package according to an aspect.

FIG. 6 depicts a flowchart 600 depicting example assembly operations for assembling a power module package according to an aspect. Although the flowchart 600 is described with reference to the power module package 100, the flowchart may be applicable to any of the power module packages discussed herein. Although the flowchart 600 of FIG. 6 illustrates operations in sequential order, it will be appreciated that this is merely an example, and that additional or alternative operations may be included. Further, operations of FIG. 6 and related operations may be executed in a different order than that shown, or in a parallel or overlapping fashion.

Operation 602 includes providing a module carrier 104, where the module carrier 104 includes a first region 114-1 defining a first heat-sink slot 120-1 and a second region 114-1 defining a second heat-sink slot 120-2. Operation 604 includes applying an adhesive material 112 to the first region 114-1 and the second region 114-2. Operation 606 includes inserting a first heat sink 110-1 coupled to a first power module 102-1 through the heat-sink slot 120-1 until the first power module 102-1 contacts the adhesive material 112. Operation 608 includes inserting a second heat sink 110-2 coupled to a second power module 102-2 through the heat-sink slot 120-2 until the second power module 102-2 contacts the adhesive material 112.

Figure 7A:
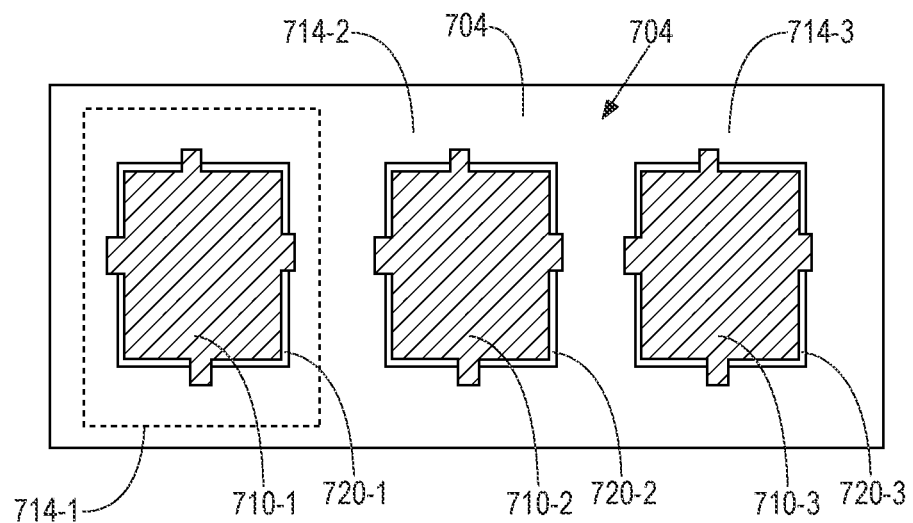
FIGS. 7A through 7D illustrate a power module package that is assembled according to another aspect.
Figure 7B:
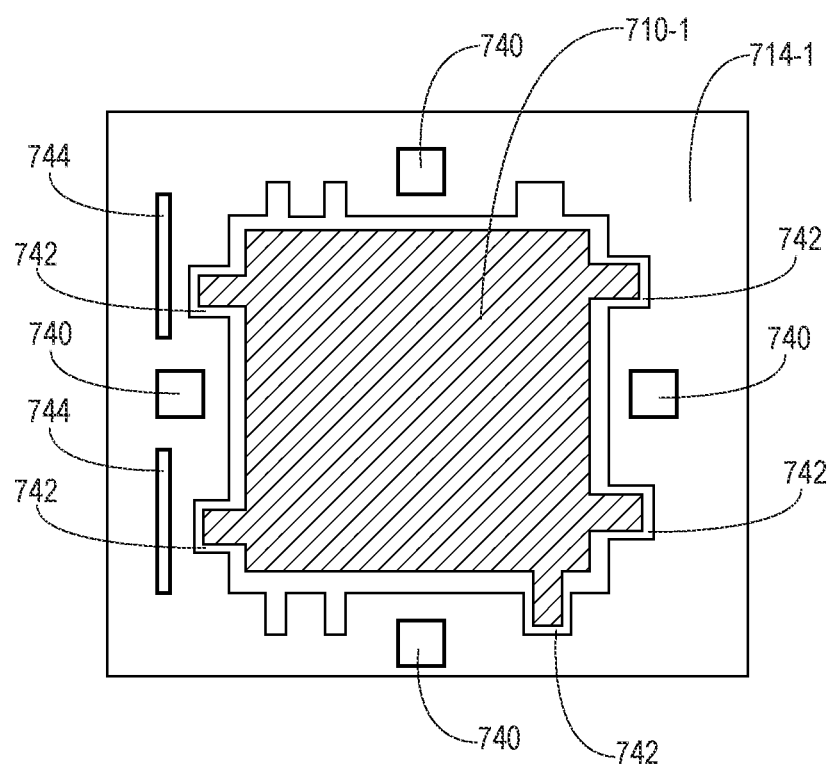
Figure 7C:
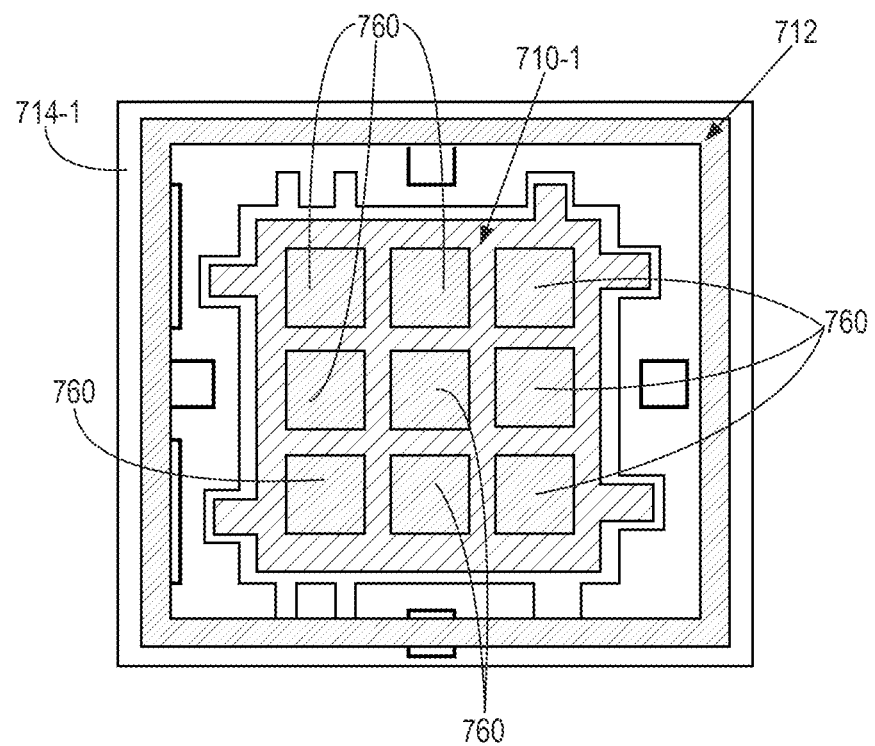
Figure 7D:
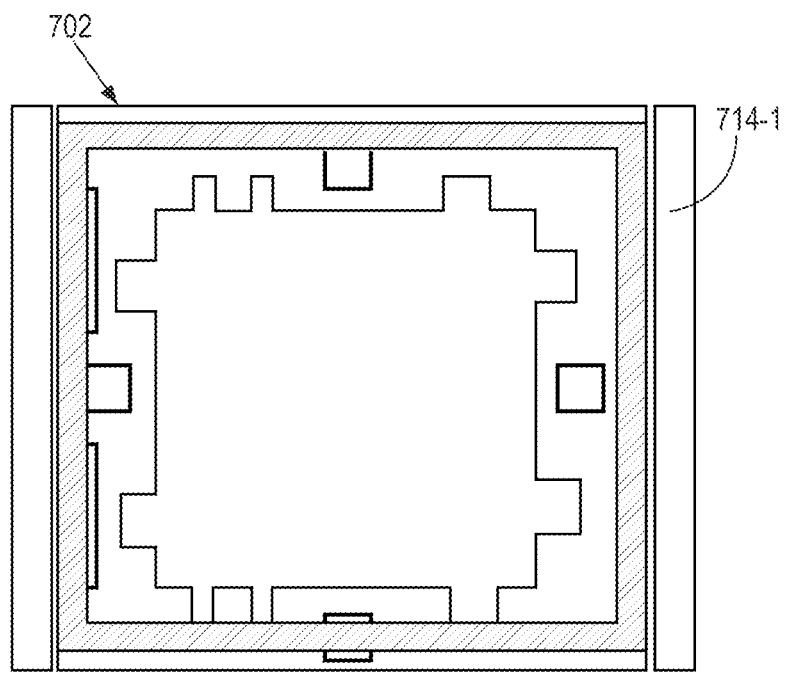

FIGS. 7A through 7D illustrate a power module package that is assembled according to a second assembly process. The power module package of FIGS. 7A through 7D may be an example of any of the power module packages discussed with reference to the previous figures. FIG. 7A illustrates a module carrier 704 defining a first region 714-1, a second region 714-2, and a third region 714-3. The first region 714-1 defines a first heat-sink slot 720-1. The second region 714-2 defines a second heat-sink slot 720-2. The third region 714-3 defines a third heat-sink slot 720-3. In contrast to FIGS. 5A through 5F, the heat sinks (e.g., a first heat sink 710-1, a second heat sink 710-2, a third heat sink 710-3) are not coupled to the power modules at the start of the second assembly process. Rather, the first heat sink 710-1 is inserted into the first heat-sink slot 720-1, the second heat sink 710-2 is inserted into the second heat-sink slot 720-2, and the third heat sink 710-3 is inserted into the third heat-sink slot 720-3. FIG. 7B illustrates a perspective of the first region 714-1 that defines module positioning guides 740, heat-sink positioning guides 742, and/or adhesive stop features 744. FIG. 7C illustrates an adhesive material 512 applied to the first region 514-1 and the first heat sink 710-1. In some examples, separate (small) portions 760 are applied to the first heat sink 710-1. In some examples, a single large portion 760 is applied to the first heat sink 710-1. FIG. 5E illustrates a power module 702 coupled to the first region 714-1 and the first heat sink 710-1 via the adhesive material 712.

Before the second assembly process starts, the first heat sink 710-1, the second heat sink 710-2, the third heat sink 710-3 are not coupled to the power modules. Rather, the first heat sink 710-1, the second heat sink 710-2, the third heat sink 710-3 are inserted into the first heat-sink slot 720-1, the second heat-sink slot 720-2, and the third heat-sink slot 720-3, respectively. Then, the adhesive material 712 is applied to each of the first region 714-1, the second region 714-2, and the third region 714-3, the first heat sink 710-1, the second heat sink 710-2, and the third heat sink 710-3. Then, a first power module is attached to the first region 714-1 and the first heat sink 710-1, a second power module is attached to the second region 714-2 and the second heat sink 710-2, and a third power module is attached to the third region 714-2 and the third heat sink 710-3. Then, the module carrier 704 with the first power module, the second power module, and the third power module may be cured (e.g., oven cured) to cure the adhesive material 712.

Figure 8:
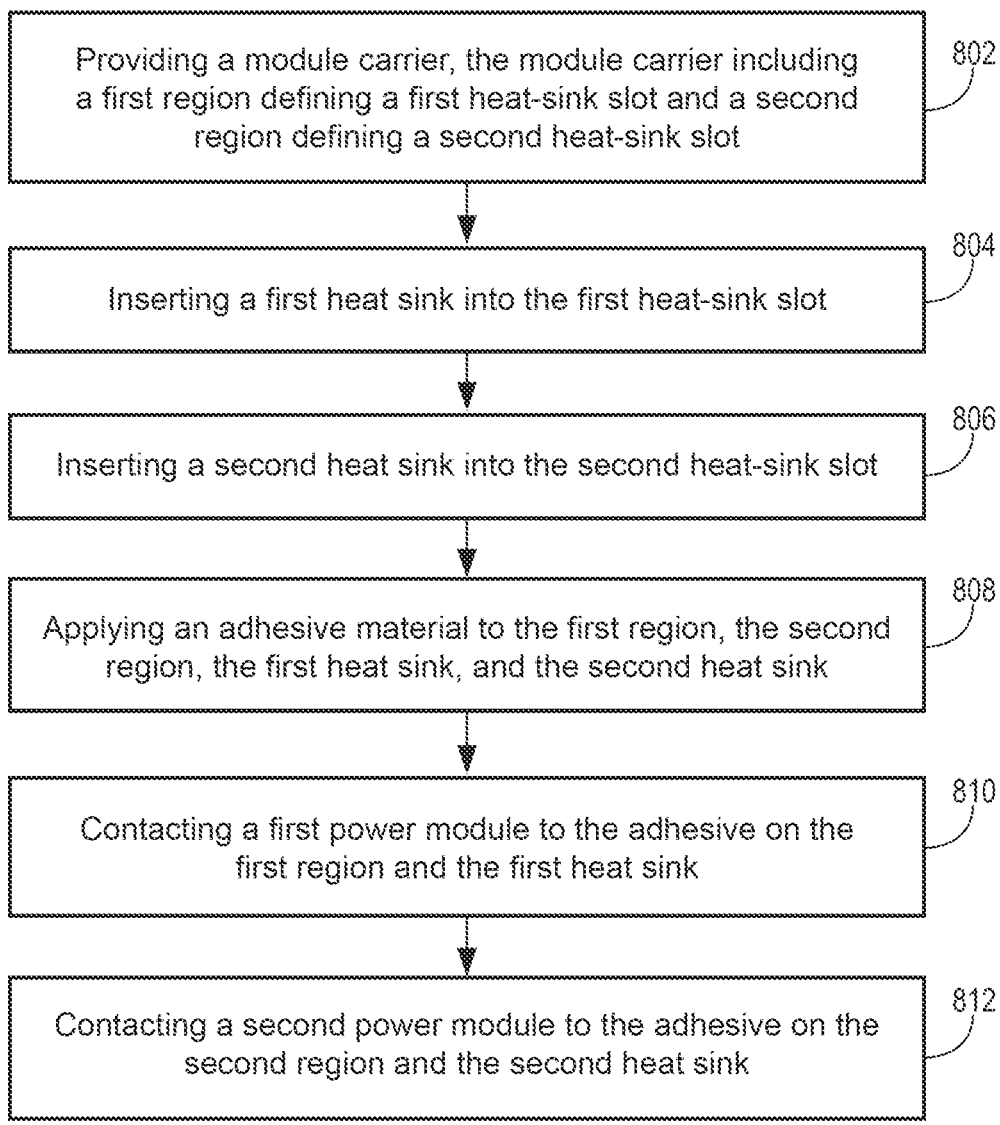
FIG. 8 illustrates a flowchart depicting example operations for assembling a power module package according to an aspect.

FIG. 8 depicts a flowchart 800 depicting example assembly operations for assembling a power module package according to an aspect. Although the flowchart 800 is described with reference to the power module package 100, the flowchart may be applicable to any of the power module packages discussed herein. Although the flowchart 800 of FIG. 8 illustrates operations in sequential order, it will be appreciated that this is merely an example, and that additional or alternative operations may be included. Further, operations of FIG. 8 and related operations may be executed in a different order than that shown, or in a parallel or overlapping fashion.

Operation 802 includes providing a module carrier 104, where the module carrier 104 includes a first region 114-1 defining a first heat-sink slot 120-1 and a second region 114-2 defining a second heat-sink slot 120-2. Operation 804 includes inserting a first heat sink 110-1 into the first heat-sink slot 120-1. Operation 806 includes inserting a second heat sink 110-2 into the second heat-sink slot 120-2. Operation 808 includes applying an adhesive material 112 to the first region 114-1, the second region 114-2, the first heat sink 110-1, and the second heat sink 110-2. Operation 810 includes contacting a first power module 102-1 to the adhesive material 112 on the first region 114-1 and the first heat sink 110-1. Operation 812 includes contacting a second power module 102-2 to the adhesive material 112 on the second region 114-2 and the second heat sink 110-2.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A method of assembly a power module package integrating multiple power modules, the method comprising:
    receiving a module carrier, the module carrier including a first region defining a first heat-sink slot and a second region defining a second heat-sink slot;
    applying an adhesive material to the first region and the second region;
    inserting a first heat sink coupled to a first power module through the first heat-sink slot until the first power module contacts the adhesive material; and
    inserting a second heat sink coupled to a second power module through the second heat-sink slot until the second power module contacts the adhesive material.
2. The method of claim 1, further comprising:
    applying heat to the adhesive material.
3. The method of claim 1, further comprising:
    coupling a housing to the module carrier; and
    positioning a ring member between the module carrier and the housing.
4. The method of claim 3, wherein the housing is coupled to the module carrier via one or more fasteners.
5. The method of claim 1, wherein the first region includes a protrusion that extends from a surface of the module carrier, the method further comprising:
    inserting the protrusion into a slot defined by the first power module.
6. The method of claim 1, wherein the module carrier includes a third region defining a third heat-sink slot, the method further comprising:
    applying the adhesive material to the third region; and
    inserting a third heat sink coupled to a third power module through the third heat-sink slot until the third power module contacts the adhesive material on the third region.
7. The method of claim 6, wherein each of the first power module, the second power module, and the third power module correspond to a separate phase of a three phase current of an inverter.
8. The method of claim 6, further comprising:
    positioning a ring member between the module carrier and a housing, the ring member extending around the first power module, the second power module, and the third power module, collectively.
9. The method of claim 1, wherein the first region includes a slot that extends into a portion of the module carrier, the method further comprising:
    in response to applying the adhesive material to the first region, receiving a portion of the adhesive material in the slot.
10. The method of claim 1, wherein the first power module includes a half-bridge module.
11. A method of assembly a power module package integrating multiple power modules, the method comprising:
    receiving a module carrier, the module carrier including a first region defining a first heat-sink slot and a second region defining a second heat-sink slot;
    inserting a first heat sink into the first heat-sink slot;
    inserting a second heat sink into the second heat-sink slot;
    applying an adhesive material to the first region, the second region, the first heat sink, and the second heat sink;
    contacting a first power module to the adhesive material on the first region and the first heat sink; and
    contacting a second power module to the adhesive material on the second region and the second heat sink.
12. The method of claim 11, further comprising:
    applying heat to the adhesive material.
13. The method of claim 11, further comprising:
    coupling a housing to the module carrier; and
    positioning a ring member between the module carrier and the housing.
14. The method of claim 13, wherein the housing is coupled to the module carrier via one or more fasteners.
15. The method of claim 11, wherein the first region includes a protrusion that extends from a surface of the module carrier, the method further comprising:
    inserting the protrusion into a slot defined by the first power module.
16. The method of claim 11, wherein the module carrier includes a third region defining a third heat-sink slot, the method further comprising:
    inserting a third heat sink into the third heat-sink slot;
    applying the adhesive material to the third region and the third heat sink;
    contacting a third power module to the adhesive material on the third region and the third heat sink.
17. The method of claim 16, wherein each of the first power module, the second power module, and the third power module correspond to a separate phase of a three phase current of an inverter.
18. The method of claim 16, further comprising:
    positioning a ring member between the module carrier and a housing, the ring member extending around the first power module, the second power module, and the third power module, collectively.
19. The method of claim 11, wherein the first region includes a slot that extends into a portion of the module carrier, the method further comprising:
    in response to applying the adhesive material to the first region, receiving a portion of the adhesive material in the slot.
20. The method of claim 11, wherein each of the first heat sink and the second heat sink includes a pin fin heat sink.

* * * * *